United States Patent [19]

Copeland, III et al.

[11] 3,993,916
[45] Nov. 23, 1976

[54] FUNCTIONALLY STATIC TYPE SEMICONDUCTOR SHIFT REGISTER WITH HALF DYNAMIC-HALF STATIC STAGES

[75] Inventors: John Alexander Copeland, III, Watchung; Robert Harold Krambeck, Warren, both of N.J.

[73] Assignee: Bell Telephone Laboratories, Incorporated, Murray Hill, N.J.

[22] Filed: May 21, 1975

[21] Appl. No.: 579,390

[52] U.S. Cl. .................. 307/221 C; 307/223 C; 307/225 C; 235/92 SH
[51] Int. Cl.² ......................................... G11C 19/28
[58] Field of Search ............... 307/214, 205, 221 C, 307/223 C, 225 C, 214; 235/92 Q, 92 DP, 92 SH

[56] References Cited
UNITED STATES PATENTS

| | | | |
|---|---|---|---|
| 3,641,360 | 2/1972 | Yao | 307/221 C |
| 3,644,750 | 2/1972 | Campbell | 307/221 C |
| 3,739,193 | 6/1973 | Pryor | 307/251 X |
| 3,838,293 | 9/1974 | Shah | 307/221 C |

*Primary Examiner*—John Zazworsky
*Attorney, Agent, or Firm*—D. Caplan

[57] ABSTRACT

This invention furnishes a semiconductor shift register circuit characterized in that each stage of the register contains a dynamic "master" portion feeding a static "slave" portion. The register circuit is driven by a suitable clock voltage circuit such that if the signal source for the clock circuit should stop, then the information in each stage is retained and is stored in the static portion. In this way, the overall performance of the shift register is static in the sense that the information in the register is not lost during temporary stoppage of the driving clock; yet, fewer electrical component elements are required per entire stage than in the case of a fully static stage.

11 Claims, 8 Drawing Figures

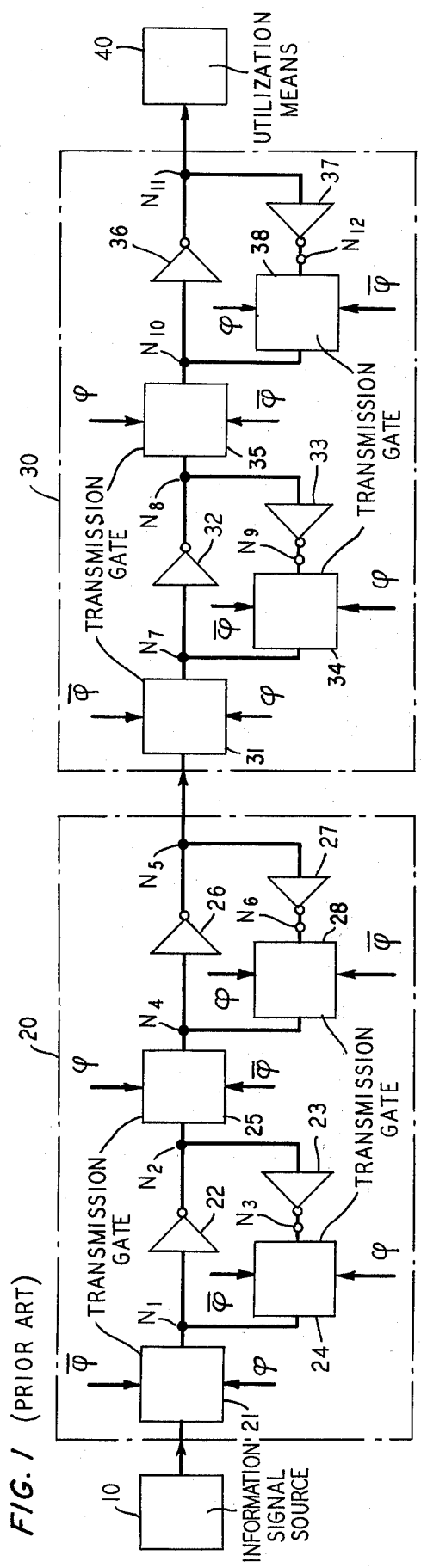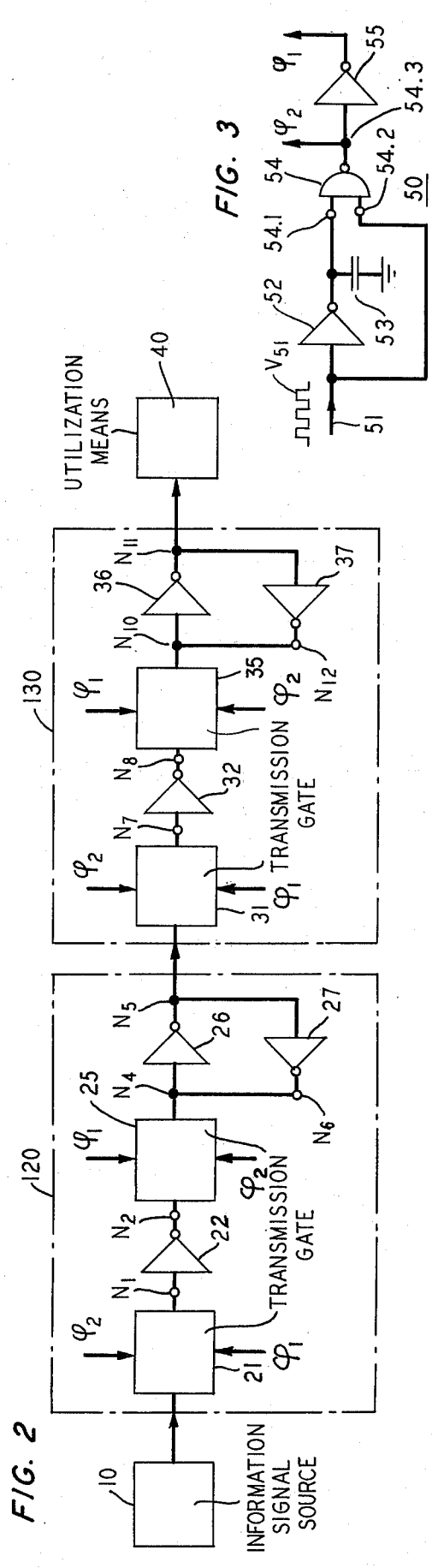

3,993,916

FUNCTIONALLY STATIC TYPE SEMICONDUCTOR SHIFT REGISTER WITH HALF DYNAMIC-HALF STATIC STAGES

FIELD OF THE INVENTION

This invention relates to the field of semiconductor apparatus, more particularly to semiconductor shift register circuits.

BACKGROUND OF THE INVENTION

In many types of logic and computer circuit applications, it is desired to have circuit means for delaying an information signal containing a data stream of binary digits. One device for accomplishing this purpose is a shift register device circuit. Such shift register devices are made up of successive stages. In the semiconductor circuit realization of such a register, each of the stages typically includes both semiconductor transmission gate elements and semiconductor inverter elements.

During operation of a shift register device, each stage at any moment of time contains a binary digital bit of information represented by a relatively "high" vs. "low" voltage level at a node in the stage. Each such bit of information is retained in its corresponding stage for a single periodic cycle of a clock pulse voltage source which drives all the various stages simultaneously, and each stage feeds its information bit periodically (at the termination of each clock cycle) to the next succeeding stage. Thus, in response to a sequence of these clock pulses, each bit of information sequentially passes through the entire shift register from an initial input register stage to a final output register stage. During each clock cycle, moreover, the input stage receives a fresh bit of information from a binary digital source of information, while the output stage shifts and delivers its bit of information to a utilization device.

Shift register devices are generally classified as "static" or "dynamic", respectively, depending upon whether or not the information contained in the various stages is retained in the event that the driving clock voltages suddenly become locked in one phase of a cycle, that is, the driving clocks stop. Thus, in a static shift register, all the information present at any moment in the register is stored and remains there in case the driving clock pulse voltages suffer phase stoppages; and this information will then resume being shifted, and thereafter continue to be shifted, through the register device in the event the clock pulse voltages resume their cycling; that is, the shift register device then takes up where the device had left off when the driving clocks had stopped. In a dynamic shift register, however, the information in the various stages at any moment is irretrievably lost in case the clock pulse voltages temporarily stop. Thus, static shift registers have the advantage over dynamic shift registers insofar as retention of information during driving clock stoppage is concerned. On the other hand, static shift registers in the art of semiconductor circuits require more semiconductor circuit elements per stage and hence require more space one the semiconductor wafer (chip) in which the shift register circuit is built. For example, each stage of a static shift register circuit which is driven by a two-phase clock ordinarily requires four electrical transmission gate elements plus four electrical inverter elements; whereas a two-phase dynamic register requires only two such gates plus two such inverters. This added semiconductor wafer space requirement of static shift register circuits presents a serious problem because manufacturing yields in the semiconductor art decrease sharply with increased semiconductor wafer area.

It would therefore be desirable to have a semiconductor shift register circuit which requires fewer circuit components per stage than the static shift register circuits of the prior art, but which retains the information in case of driving clock stoppage.

SUMMARY OF THE INVENTION

In order to reduce the requisite semiconductor wafer space for a semiconductor shift register circuit which retains the information therein during stoppages of the driving clock, a shift register circuit is designed in which each stage is half static and half dynamic. In addition, each stage is driven by a clock driving circuit which is designed such that, if and when the driving clock should stop, the information in every stage of the register becomes stored in the static portion of the stage. Thereby, in case of driving clock stoppage, all the information then in the shift register is stored therein and remains available for resumption of further shifting when the driving clock resumes.

In a specific embodiment of the invention, a semiconductor shift register circut is designed in accordance with complementary metal oxide semiconductor (MOS) technology with each stage containing a dynamic portion feeding a static portion. Each dynamic portion consists essentially of a first semiconductor gate driving a first semiconductor inverter, whereas each static portion consists essentially of a second gate feeding a second inverter across which is connected a feedback loop. Each such feedback loop, while in the prior art ordinarily containing a third inverter feeding a third transmission gate, is simplified to the third inverter alone, omitting the third transmission gate. THe third inverter advantageously has a suitably small IGFET channel width to channel length ratio (Z/L) as compared with that in both the first and second gates as well as in the first inverter, in order that the first inverter should have a larger conductance than, and predominate over, the third inverter in driving the second inverter; that is, a "master-slave" relation is preserved with respect to the dynamic-static portions of each stage. Moreover, a clock driving circuit for each stage is provided which ensures that in case of driving clock stoppages the information in each stage of the shift register is transferred into the static portion and remains therein until resumption of clock cycles. Such a driving circuit can take the form of an input inverter feeding a NAND gate which in turn feeds an output inverter. This clock driving circuit itself is driven by a two-level pulse cycle, such as a square wave, for example; and then the voltages at the input and output terminals, respectively, of the output inverter of the driving circuit will be suitable for driving transmission gates in the static and dynamic portions of each stage of the shaft register. This driving clock circuit, together with the shift register circuit, is advantageous integrated in a single wafer in accordance with complementary MOS technology.

As known in the art, an electrical frequency divider, for the purpose for example of counting pulses, can be formed by a shift register with suitable feedback. Accordingly, a static type functioning form of such a frequency divider can be made in accordance with the invention for the purpose of counting pulses, that is, a pulse counter which does not lose count if and when the driving clock becomes stuck or frozen. Each stage of such a frequency divider contains a dynamic portion feeding a static portion, thereby providing fully static operation, but with a saving on the number of the required inverters.

BRIEF DESCRIPTION OF THE DRAWINGS

This invention, together with its features, advantages, and objects may be better understood from the following detailed description when read in conjunction with the drawings in which:

FIG. 1 is a circuit diagram of a static type of a semiconductor shift register of the prior art;

FIG. 2 is a circuit diagram of a semiconductor shift register with stages containing dynamic and static portions;

FIG. 3 is a circuit diagram of driving circuit useful in the operation of the shift register circuit shown in FIG. 2;

DETAILED DESCRIPTION

Figure 3A:
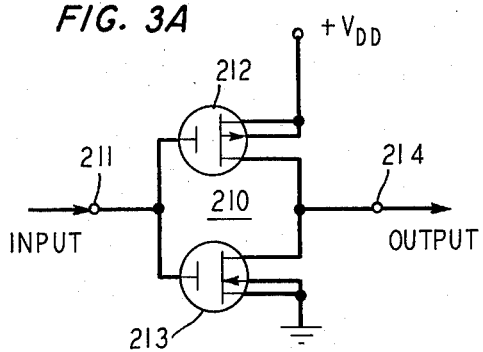
FIG. 3A is a circuit diagram of a complementary MOS type inverter element, useful in the circuits shown in FIGS. 1, 2 and 3.
Figure 3B:
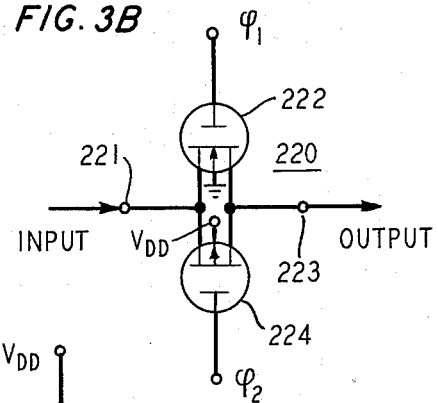
FIG. 3B is a circuit diagram of a complementary MOS type transmission gate element, useful in the circuits shown in FIGS. 1, 2, and 3.

FIG. 1 shows a two-stage static type of semiconductor shift register circuit of the prior art. An information signal source 10 provides a sequence of signal levels $S_1$, $S_2$, $S_3$ ... of binary digital information bits to be shifted sequentially through first and second stages 20 and 30 of the circuit to a utilization means 40 for utilizing the consequent two-stage delayed signal output of the second stage 30. Elements labeled 22, 23, 26, 27 in the first stage 20, as well as elements 32, 33, 36 and 37 in the second stage 30, are all inverters. A typical such inverter in complementary MOS technology is shown in FIG. 3A. Square block elements 21, 22, 24, 25 and 28 of the first stage 20, as well as square block elements 31, 32, 34, 35 and 38 of the second stage 30, all represent semiconductor transmission gates, each being controlled by driving clock square wave pulse sequence $\phi$ and its complementary sequence $\overline{\phi}$ with respect to time, as indicated in FIG. 1. A typical such transmission gate element in complementary MOS technology is illustrated in FIG. 3B. Thus, when the transmission gates controlled by the combination of $\phi$ and $\overline{\phi}$ (hereinafter abbreviated as $\phi\overline{\phi}$) are turned "on" ("active phase" of $\phi$) the gates controlled by the combination of $\overline{\phi}$ and $\phi$ (hereinafter abreviated as $\overline{\phi}\phi$) are turned "off" ("passive phase" of $\overline{\phi}$), and vice versa.

In operation, the signal source 10 provides a signal level to the transmission gate 21. During a first active phase of $\overline{\phi}$ (simultaneous with a first passive phase of $\phi$) this gate 21 enables this signal to pass through to the inverter 22, the gates 24 and 25 then being "off". Thus, after the commencement of this active first active phase of $\overline{\phi}$, node $N_1$ is at an electrical potential representative of the binary digital information signal level $S_1$ of the source 10 during this first clock phase, whereas node $N_2$ is at an electrical potential representative of the invention $\overline{S_1}$ (by reason of inverter 22) of this signal level $S_1$. Node $N_3$ is also then at the potential representative of the signal level $S_1$ of source 10 during the first clock pulse (by reason of two inversions, one by inverter 22 and the other by inverter 23).

Upon the termination of the first active phase of $\overline{\phi}$, a second phase of $\overline{\phi}$ commences (simultaneously with a second active phase of $\phi$) during which all those gates which were "on" (or "off") during the first phase are now "off" (or "on", respectively) during the second phase. In particular, during this second clock phase, since gate 25 is "on", the signal level $\overline{S_1}$ is present at node $N_4$; and hence the (doubly inverted) signal level $S_1$ is present at node $N_5$, and the (inverted) signal level $\overline{S_1}$ is at node $N_6$. On the other hand, during this second phaes, the signal $S_1$ is now still at nodes $N_1$ and $N_3$ (with $\overline{S_1}$ at node $N_2$), the gate 24 being "on" and the gate 21 being "off". Thus during the second phase, $S_1$ and $\overline{S_1}$ fill the entire first stage 20. Immediately succeeding this second clock phase, a third clock phase occurs during which the gates controlled by $\overline{\phi}$ and $\phi$ are in the same "on" or "off" conditions as during the first phase. In particular, gate 21 is now "on" during this third phase; whereas gate 24 in the first loop ($N_1N_2N_3$) of the first stage 20 is "off" thereby suppressing any further feedback of $S_1$ in this first loop ($N_1$, $N_2$, $N_3$). Therefore, the signal level $S_3$ supplied by the source 10 is enabled during the third phase to be established at nodes $N_1$ and $N_3$ with the complementary level $\overline{S_3}$ at node $N_2$. Thus, $\overline{S_3}$ (for $S_3$) is established in the first loop of the first stage 20 all during the third clock pulse; while $S_1$ (or $\overline{S_1}$) is established both in the second loop ($N_4N_5N_6$) of the first stage 20 as well as in the first loop ($N_7N_8N_9$) of the second stage 30. Similarly, during this third phase, the signal level $S_1$ is now at nodes $N_5$, $N_7$, and $N_9$, while the signal level $\overline{S_1}$ is at nodes $N_4$, $N_6$, and $N_8$. Thus, signal levels $S_1$ and $\overline{S_1}$ are established in the first loop of the second stage 30 during the third clock phase in like manner as they were in the first loop in the first stage 20 during the first clock phase. During the odd numbered phases, the first loop of each stage contains a different information bit from the second loop of the stage; whereas during the even numbered phases, the first loop of each stage contains the same information bit as the second loop of the stage. Thus, the signal levels of the source 10 during odd numbered clock phases are fed into the first stage 20 and are subsequently sequentially shifted through the first stage 20 into the second stage 30, and ultimately to the utilization means 40.

In case of a driving clock stoppage, whereby all $\overline{\phi}\phi$ controlled gates are kept, say "on" and all $\phi\overline{\phi}$ controlled gates are kept "off", then the information bit in the second loop (now all closed loops) of each stage remains in a closed feedback loop where this information bit persists until resumption of the clock cycles; during this clock stoppage, the information bit in the first loop (now all open) of each stage remains under the control of the second loop of the immediately preceding stage. Similarly, in case of a clock stoppage whereby all $\overline{\phi}\phi$ controlled gates are "off" and all $\phi\overline{\phi}$ controlled gates are "on"; then the information bit in the first loop (now all closed) of each stage persists until resumption of the clock cycles; whereas the information bit in the second loop (now all open) of each stage is controlled by that in the first loop of the same stage. Thus, the shift register stages 20 and 30 are said to be "static", that is, during stoppage of clock cycles the information persists until resumption of clock cycling.

FIG. 2 shows a circuit for a shift register in accordance with the invention, advantageously to be operated in conjunction with the two-level driving clock pulse phases $\phi_1$ and $\phi_2$ supplied by a pulse-supply circuit 50 shown in FIG. 3. The circuit of FIG. 2 otherwise differs from that of FIG. 1 only in the fewer number of components required in FIG. 2 as well as in the relative values of certain design parameters for these components as will be discussed below. Accordingly, the same reference numerals are used in FIGS. 1 and 2 for similar component elements.

Figure 3C:
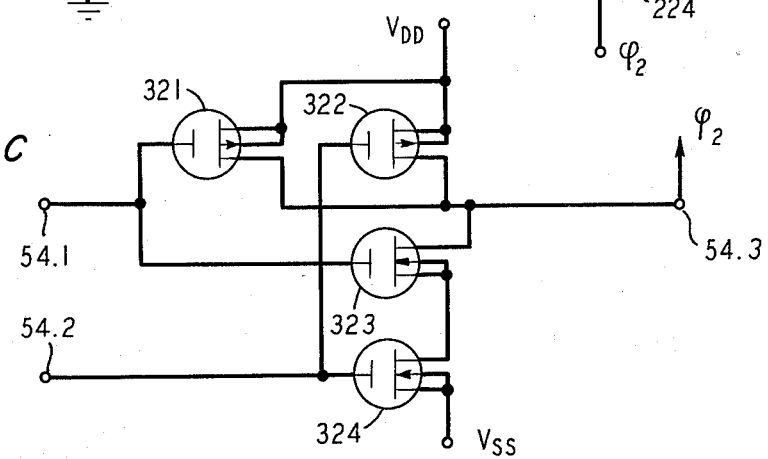
FIG. 3C is a schematic diagram of a complementary MOS type NAND gate useful in the circuit of FIG. 3.
Figure 4:
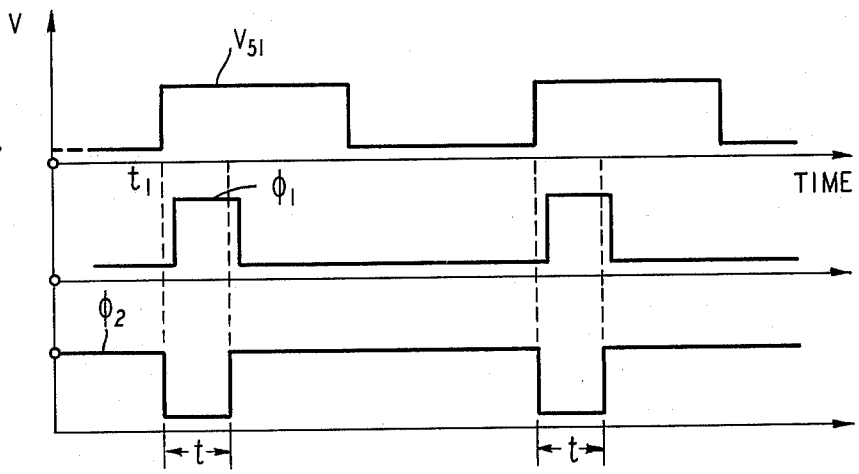
FIG. 4 is a plot of outputs $\phi_2$ and $\phi_1$, vs. time, useful in explaining the operation of the circuit shown in FIG. 3.

During now operation, the pulse supply circuit 50 in FIG. 3 provides driving clock pulse $\phi_1$ and $\phi_2$ in the form of complementary square waves in response to an input to terminal 51 in the form of a typically square wave type of binary level clock input $V_{51}$, as indicated in FIG. 4. The periodicity of this clock input 51 is advantageously greater than the time constant T of the circuit 50 determined by both the Z/L ratio in an inverter 52 and the size of an MOS capacitor 53 controlling an input terminal 54.1 of a NAND gate 54. A complementary MOS form of such a NAND gate is shown in FIG. 3C. This NAND gate 54 is responsive to combinations of "high" and "low" level inputs to its respective input terminals 54.1 and 54.2. The output $\phi_2$ of the NAND gate 54 to an output inverter 55 will be "low" if and only if both the inputs to its input terminal 54.1 and 54.2 are "high", that is, higher than a binary discrimination level of this NAND gate; and the output $\phi_2$ will be "low" otherwise. By reason of the functioning of the output inverter 55, of course, its output $\phi_1$ is complementary to $\phi_2$.

As indicated in FIG. 4, when a binary clock input $V_{51}$ remains "low" for a time substantially greater than the time constant T, then the input at terminal 54.1 settles to a "high" level while the input at terminal 54.2 is "low", so that the output $\phi_2$ at the output terminal 54.3 of the NAND gate is "high" ($\phi_1$ is "low"). When the clock input $V_{51}$ shifts to "high", say at time $t_1$ (FIG. 4), then for a time less than the time constant T the input at terminal 54.1 persists at "high", whereas the input at terminal 54.2 shifts to "high" and remains at this "high" level until the next shift of the clock input $V_{51}$ to "low". Thus, on the shift of input 51 of "high", the output $\phi_2$ of the NAND gate 54 will shift to "low", and hence the output $\phi_1$ will shift to "high"; and these conditions of $\phi_1$ and $\phi_2$ will persist for a time $t$ of the order of the time constant T, depending more precisely on the binary discrimination level of the NAND gate 54. Moreover, after this time $t$ has elapsed, and while the clock input $V_{51}$ is still "high", then the input at terminal 54.1 shifts to "low", the input at terminal 54.2 remaining "high". Accordingly, after time $t$ has elapsed with clock input $V_{51}$ still "high", then the output $\phi_2$ shifts to "high", and hence the output $\phi_1$ shifts to "low". Thereafter, when the input $V_{51}$ shifts back to "low", there will be no change in this "low" level of $\phi_2$, because the input at terminal 54.2 is "low". This "low" level of $\phi_2$ persists until the level of clock input $V_{51}$ shifts again into "high". Thus, in case the input to the terminal 51 becomes frozen at either a "high" or "low" level, the output $\phi_2$ will be frozen at a "high" level while the output $\phi_1$ will be frozen at a "low" level. It should be noted that due to an unimportant slight delay in the inverter 55, $\phi_1$ shifts slightly after $\phi_2$ shifts (FIG. 4).

Advantageously the outputs $\phi_2$ and $\phi_1$ of the circuit shown in FIG. 3 are delivered to the transmission gates of the circuit shown in FIG. 2 such that those gates controlled by $\phi_2\phi_1$ are "on" when the driving $\phi_2$ level is "high" and are "off" otherwise, and those gates controlled by $\phi_1\phi_2$ are "on" when the $\phi_1$ level is "high" and are "off" otherwise. Thus, during normal operation, when the input 51 (FIG. 3) is a square wave of periodicity greater than $t$, the circuit shown in FIG. 2 operates as a normal shift register of two stages 120 and 130. If and when the clock input 51 becomes temporarily frozen at any level, then within the time interval $t$ (immediately if input 51 is frozen at its "low" level) those transmission gates controlled by $\phi_1\phi_2$ will be temporarily frozen into their "off" states and those transmission gates controlled by $\phi_2\phi_1$ will be temporarily frozen into their "on" states, until the input 51 returns to normal operation. Thus, during the stoppage of the clock input 51, the transmission gates at the front ends (left-hand ends in FIG. 2) of the static portions of each stage will be "off" while the transmission gates, if any, (not shown, as not essential) in the feedback loops of the static portions and the transmission gates at the front ends of the dynamic portions will be "on", thus freezing and storing the information states in the respective inverter feedback loops of the different stages, until the clock input 51 resumes normal operation. It will be recognized that each of these stages is composed of a first "dynamic" portion feeding a second static (loop) portion, the dynamic portion in the stage 120 for example, comprising the transmission gate 21 electrically feeding the inverter 22 and the static portion comprising the transmission gate 25 electrically feeding the inverter 26 with feedback from the inverter 27. However, a gate is advantageously omitted in the feedback loop of each static portion, in order to economize further on the required semiconductor components. This omission of these gates can be made provided the channel width to length ratio (Z/L) of the IGFET in inverters 27 and 37 in the respective feedback loops in the register stages 120 and 130 be chosen at least about an order of magnitude less than the Z/L ratios of inverters 26 and 36 as well as the Z/L ratios of the remaining inverters and transmission gates. Typically, the Z/L ratio of the feedback loop inverters 27 and 37 is typically about 0.2, while the Z/L ratios of the other inverters and transmission gates in FIG. 2 are typically about 4.5. Typically, for shift register operation at a frequency of about 1 Megahertz, the Z/L ratio of the IGFET in the inverter 52 (FIG. 3) is typically 0.2, whereas the Z/L ratios of the NAND gate 54 and the inverter 55 are both about 4.5. The MOS capacitor 53 typically has width and length of about 40 microns for an oxide thickness of 1,000 Angstroms.

FIG. 3A shows a typical complementary MOS inverter 210, having an input terminal 211 and an output terminal 214, useful for the circuit shown in FIG. 2. As known in the art, when the input terminal 211 is held at ground, then the p-channel IGFET 212 is "on" while the n-channel IGFET 213 is "off", thereby bringing the output terminal 214 to ground; whereas, when the input terminal 211 is given a positive voltage signal, then the p-channel IGFET is turned "off" while the n-channel IGFET is turned "on", thereby bringing the output terminal 214 to the (positive) voltage of a voltage supply source $V_{DD}$. Thus, there is an inversion of output relative to input, with gain depending on the parameters of the IGFETs 212 and 213, particularly the channel width to length ratio (Z/L).

FIG. 3B shows a typical complementary MOS transmission gate 220 having an input terminal 221 and an output terminal 223. An n-channel IGFET 222 has its gate connected to clock $\phi_2$, and a p-channel IGFET 224 has its gate connected to clock $\phi_1$. Thus, when clock $\phi_1$ goes positive (complementary $\phi_2$ goes negative) the n-channel IGFET 222 turns "on" (p-channel IGFET 224 also turns "on"), so that the input to output terminal resistance is low, that is, the transmission gate 220 is turned "on". Conversely, when clock $\phi_1$ goes negative ($\phi_2$ goes positive), then the n-channel IGFET 222 turns "off" (p-channel IGFET 224 also turns "off"), so that the input to output terminal resistance is high, that is, the transmission gate 220 is turned "off".

FIG. 3C shows a typical complementary MOS NAND gate useful for the circuit shown in FIG. 3. The input terminal 54.1 is connected to a gate electrode of an n-channel IGFET 323 and of a p-channel IGFET 321; whereas the input terminal 54.2 is connected to a gate electrode of an n-channel IGFET 324 and of a p-channel IGFET 322. The p-channel IGFETs 321 and 322 are connected in parallel with respect to a voltage supply source $V_{DD}$ and an output terminal 54.3; whereas the n-channel IGFETs 323 and 324 are connectd in series between a voltage supply source $V_{SS}$ and the output terminal 54.3, as known in the art. Typically, $V_{DD}$ is about 3 to 15 volts, while $V_{SS}$ is about 0. volts.

Figure 5:
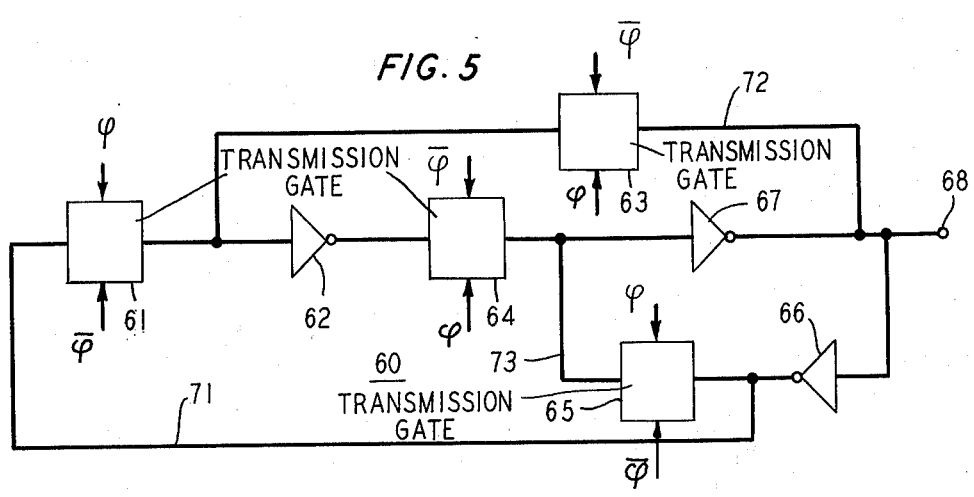
FIG. 5 is a schematic diagram of an electrical frequency divider type of counter circuit in accordance with another specific embodiment of the invention.

FIG. 5 is a circuit diagram of a frequency divider type of electrical counter circuit 60 in accordance with another specific embodiment of the invention. As known in the art, an electrical counter of this type can be formed by a shift register with suitable feedback. In this circuit 60, transmission gates 61 and 65 are controlled by clock pulses $\phi$ and $\overline{\phi}$, whereas transmission gates 63 and 64 are controlled by complementary clock pulses $\overline{\phi}\phi$. Alternatively, $\phi_1$ and $\phi_2$ (FIG. 4) type pulses can be used. This circuit also has static characteristics in the sense that during clock stoppages the information is retained; that is, when the clocks $\phi$ and $\overline{\phi}$ become frozen, with one "high" and the other "low", then the on-off counting state of the output terminal 68 is preserved. In this circuit 60, the inverters 62 and 67 form a static flip-flop when the gates 63 and 64 (controlled by $\overline{\phi}\phi$) are "on", whereas the inverters 66 and 67 form a static flip-flop when the gates 61 and 65 (controlled by $\phi\overline{\phi}$) are "on". This sharing of inverter 67 thus gives rise to a pair of flip-flops using only three inverters, instead of ordinarily required four inverters. The feedback loop 71 is required for counter operation, whereas the feedback loop 72 is required to stabilize the input to inverter 62 when the transmission gate 65 is "off" (gate 63 then "on"). In order for the circuit 60 to operate properly, it is necessary that when the gates 63 and 64 (controlled by $\overline{\phi}\phi$) turn "on", then the inverter 62 should force the inverter 67 to charge its state (similarly as in shaft register operation described above). However, this change of state of inverter 67 is somewhat more difficult to obtain than in the case of the previously described shift register circuit shown in FIG. 2, because the inverter 62 is then fighting not only against the inverter 66 (as in shift register operation) but also against the inverter 67 whose state is then being fed back through the transmission gate 63 (which is then turned "on"). Therefore, the added transmission gate 65 is inserted in the feedback loop 73. Advantageously in this circuit 60, the Z/L ratios of the IGFETs associated with the inverter 62 and the transmission gate 64 are all about four times the Z/L ratios of the IGFETs in the inverter 67 and the transmission gate 63. For example, the Z/L ratios of inverter 62 and gate 64 are both equal to about 2, while the Z/L ratios of the inverter 67 and the gate 63 are both equal to about 0.5. Moreover, the Z/L ratios of the remaining gates 61 and 65 and inverter 66 typically are all equal and in the range of typically about 2 to 5. It should be recognized that the inverters 67 and 66 together with the gates 64 and 65 form a static loop portion of a shift register stage fed by a dynamic portion formed by the inverter 62 and the gate 61 of this shift register stage.

While this invention has been described in detail with reference to specific embodiments various modifications can be made without departing from the scope of the invention. For example, other semiconductors than silicon, such as germanium or gallium arsenide may prove useful as semiconductor device materials; and other insulators than silicon dioxide or germanium oxides may be used such as silicon nitride in the structures of the transmission gates, inverters, and capacitors in this invention. It should be understood that the shift register stages of this invention, together with the pulse supply circuit 50, can be integrated in a single crystal semiconductor substrate in accordance with known silicon integrated circuit technology.

What is claimed is:

1. Semiconductor apparatus which includes a shift register stage consisting of a first and second portion, the first portion of feeding electrical signals to the second portion, said first portion consisting of a first complementary MOS inverter and a first externally controllable complementary MOS transmission gate for receiving input electrical signals and for feeding the resulting electrical output signals of said first gate to said first inverter, said second portion consisting of a second complementary MOS inverter and a second externally controllable complementary MOS transmission gate for feeding electrical output thereof to an input node of said second inverter, said first inverter having an output node for feeding electrical output signals of said first inverter to said second gate, said second portion further including a third complementary MOS inverter, said second inverter having an output node for feeding back electrical output signals from said second inverter through said third inverter to the said input node of the second inverter.

2. Semiconductor apparatus according to claim 1 which further includes circuit means external to said stage for controlling the on-off states of the first and second gates.

3. Semiconductor shift register apparatus which includes at least first and second shift register stages, each of said stages according to claim 2, the output node of the second inverter of the first stage being ohmically connected to an input node of the first gate of the second stage in order to deliver electrical output signals of the first stage to the second stage.

4. Semiconductor apparatus according to claim 3 in which said circuit means includes electrical pulse sequence circuit means for controlling the first and second transmission gates by delivering sequences of electrical pulses to both of said gates such that during operation, in response to an essentially binary level clock sequence applied to said circuit means, said circuit means provides said electrical pulse sequence to the gates whereby whenever the binary level clock sequence is temporarily locked in either of said binary levels then the circuit means is locked such that information shifting through each and every stage is stored in the second portion of such stage.

5. Semiconductor apparatus which includes a shift register state consisting of a first portion for feeding electrical signals to a second portion, said first portion consisting of a first complementary MOS inverter and a first externally controllable complementary MOS transmission gate for feeding electrical output signals of said first gate to said first inverter in response to input signals applied to an input node of the first gate, said second portion consisting of a second complementary MOS inverter and a second externally controllable complementary MOS transmission gate for feeding electrical output of said second gate to an input node of said second inverter, said first inverter havng an output node for feeding electrical output signals of said first inverter to an input node of said second stage, said second portion further consisting of a third complementary MOS inverter, said second inverter having an output node for feeding electrical output signals from said second inverter through said third inverter back to the said input node of the second inverter.

6. Semiconductor apparatus according to claim 5 which further includes circuit means external to said stage for controlling the on-off states of the first and second gates.

7. Semiconductor shift register apparatus which includes at least first and second shift register stages, each of said stages according to claim 5, the output node of the second inverter of the first stage being ohmically connected to the input node of the first gate of the second stage for feeding electrical output signals from said second inverter of the first stage to the first gate of the second stage in order to deliver electrical output signals of the first stage as input to the second stage.

8. Semiconductor apparatus including a shift register stage, said stage consisting of:
a. a first externally controllable complementary MOS transmission gate having an input node for receiving input electrical signals to said stage, said first gate characterized by "on" and "off" states which are externally controllable by circuit means external to said first gate;
b. a first complementary MOS inverter having an input node for receiving electrical signals from said first gate in response to said input signals;
c. a second externally controllable complementary MOS transmission gate for receiving electrical signals from said first inverter in response to said electrical signals from the first gate received by the input node of said first inverter, said second gate characterized by "on" and "off" states which are externally controllable;
d. a second complementary MOS inverter having an output node, and having an input node for receiving electrical signals from said second gate in response to said signals from the first inverter received by the second gate; and
e. a third complementary MOS inverter having an input node for receiving electrical signals from the output node of the second inverter and having an output node for feeding back electrical signals to the input node of the second inverter in response to electrical signals delivered to the said input node of the third inverter.

9. A semiconductor shift register apparatus including at least first and second successive stages, each of said stages in accordance with claim 8, the input node of the first gate of the second stage being ohmically connected to the output node of the second inverter of the first stage for receiving electrical signals from said output node of the second inverter of the first stage.

10. Apparatus according to claim 8 which further includes electrical circuit means for controlling the on-off stages of said first and second gates.

11. Semiconductor apparatus according to claim 10 in which said circuit means includes electrical pulse sequence circuit means for controlling the "on" and "off" states of the first and second transmission gates by delivering sequences of electrical pulses to both of said gates such that during operation, in response to an essentially binary level clock sequence applied to said circuit means, said circuit means provides said electrical pulse sequence to the gates whereby whenever the binary level clock sequence is temporarily locked in either of said binary levels then the circuit means is locked such that information shifting through said stage is stored in said stage.

* * * * *